United States Patent [19]
Miyamoto

[11] Patent Number: 5,878,433
[45] Date of Patent: Mar. 2, 1999

[54] ENVIRONMENTAL LOAD ASSESSING DEVICE HAVING AN OBJECT-ORIENTED DATABASE WHICH STORES, AS OBJECTS, PARTS OF AT LEAST ONE PRODUCT AND/OR PROCESSES IN A LIFE CYCLE OF THE SAME

[75] Inventor: Shigeyuki Miyamoto, Tokyo, Japan

[73] Assignee: NEC Corporation, Tokyo, Japan

[21] Appl. No.: 840,136

[22] Filed: Apr. 11, 1997

[30] Foreign Application Priority Data

Apr. 15, 1996 [JP] Japan ................................. 8-117040

[51] Int. Cl.$^6$ ................................................ G06F 17/30
[52] U.S. Cl. .............................. 707/103; 707/102; 702/1; 364/468.13
[58] Field of Search ................................. 707/102, 103, 707/104, 10; 702/1; 364/468.13; 706/45; 705/27

[56] References Cited

U.S. PATENT DOCUMENTS

| 5,412,756 | 5/1995 | Bauman et al. ........................... 706/45 |
| 5,446,890 | 8/1995 | Renslo et al. ............................ 707/104 |
| 5,615,342 | 3/1997 | Johnson ................................... 705/27 |
| 5,652,708 | 7/1997 | Miyamoto et al. ................. 364/488.13 |
| 5,694,596 | 12/1997 | Campbell ................................. 707/10 |
| 5,768,129 | 6/1998 | Miyamoto ................................. 702/1 |
| 5,806,069 | 9/1998 | Wakiyama et al. ..................... 707/102 |

*Primary Examiner*—Thomas G. Black
*Assistant Examiner*—Charles L. Rones
*Attorney, Agent, or Firm*—Whitham, Curtis & Whitham

[57] ABSTRACT

An environmental load assessing device includes an object data storage section composed of an object-oriented database. The object data storage section stores data inputted from an input section. Specifically, parts of a product to be assessed and/or processes in a life cycle of the product are stored as objects, respectively. Attribute data of the parts and/or the processes are stored as attribute data of objects corresponding to those parts and/or processes. Coupling relationships between the parts and/or between the processes are defined by classes and attribute data of objects corresponding to those parts and/or processes and stored.

28 Claims, 4 Drawing Sheets

ENVIRONMENTAL LOAD ASSESSING DEVICE HAVING AN OBJECT-ORIENTED DATABASE WHICH STORES, AS OBJECTS, PARTS OF AT LEAST ONE PRODUCT AND/ OR PROCESSES IN A LIFE CYCLE OF THE SAME

BACKGROUND OF THE INVENTION

The present invention relates to an environmental load assessing device and, in particular, to a device for evaluating or assessing environmental loads of a product in each or all of the stages of manufacture, use and disposal thereof.

Environmental load assessing devices have been used for assessing various environmental loads of products in each or all of the stages of manufacture, use and disposal thereof, and further used for developing new products with less environmental loads.

As environmental load assessing devices for assessing environmental loads over the life cycle of products including manufacture, use and disposal, computers installed with the spreadsheet software or the relational database software have been available.

The following environmental load assessing methods have been known:

Specifically, for a product assessment, "House-hold Electric Product Assessment Manual" by Household Electric Product Association and "Environmental Design Assessment Guideline for Data Processing Equipment" by Japan Electronic Industry Development Association disclose methods for pre-assessing environmental loads of the electric/electronic products. In these methods, a check sheet is used for checking whether measures have been taken, based on comparison with a reference product or based on the assessment criteria, relative to assessment items for reducing environmental loads of a product, such as reduction in weight of the product and easiness of assorting process of the product, so as to reduce the environmental loads of the product.

On the other hand, for a life-cycle assessment, Japanese First (unexamined) Patent Publication No. 7-121588, for example, discloses an environmental load assessing method for deriving environmental loads of an industrial product over the life cycle thereof and for designing an industrial product based on the derived environmental loads. Specifically, in this method, an environmental load of an industrial product about one environmental load factor is derived as the sum of an environmental load in a manufacturing process from raw materials to a product, an environmental load in a using process where the product is put on the market and used, and an environmental load in a scrapping process where the product is scrapped and disassembled to produce recycled materials. This method utilizes an environmental input/output table to derive an environmental load of an industrial product over the life cycle thereof.

For assessing a disassemblability of a product which is closely related to the recycleability of the product, the Jan. 1 1994 issue of Nikkei Mechanical, pp. 40–48, for example, discloses a method wherein assessment points on easiness of disassembling of the product are assorted based on manual disassembling basic operations so as to perform the assessment using a bad mark system.

However, the foregoing conventional environmental load assessing devices have a problem that it is difficult to describe, in detail, parts of a product to be assessed and coupling relationships between the parts, and processes in a life cycle of a product to be assessed and coupling relationships between the processes, and store them.

The actual product, particularly an electric or machine product, is composed of a large number of parts, and coupling relationships between these parts are highly complicated. For example, a certain product has a nested parts structure including some units each of which further includes some sub-units.

Similarly, the life cycle of the actual product is composed of a large number of processes, and coupling relationships between these processes are highly complicated. For example, a life cycle of a certain product has a life-cycle flow in the form of a combination of processes of manufacture of the product, manufacture of parts, procuration of materials of each part, distribution and sale of the product, use of the product, scrapping and disassembling of the product and the like.

In the foregoing conventional environmental load assessing devices in the form of the computers installed with the spreadsheet software or the relational database software, the table format is used as a format of a data storage section for storing data about parts of a product and coupling relationships between them, or data about processes in the life cycle of a product and coupling relationships between them. However, it is difficult to describe the foregoing complicated coupling relationships using the table format.

The foregoing conventional environmental load assessing devices have a further problem that it is difficult to change the contents of an environmental load assessing procedure, or add a new environmental load assessing procedure to execute a plurality of environmental load assessments.

As described above, since the table format is used as the format of the data storage section and thus the size and the logical storage location of each item is fixed, the environmental load assessment largely depends on the format of the data storage section. Thus, it is difficult to change the size and the logical storage location of the data storage section or add a new item in the data storage section so as to change the assessment contents.

SUMMARY OF THE INVENTION

It is therefore an object of the present invention to provide an improved environmental load assessing device which is capable of describing, in detail, parts of a product to be assessed and coupling relationships between them and/or processes in a life cycle of a product to be assessed and coupling relationships between them.

It is another object of the present invention to provide an improved environmental load assessing device which is capable of facilitating changing of the contents of an environmental load assessing procedure, and adding a new environmental load assessing procedure to execute a plurality of environmental load assessments.

Other objects of this invention will become clear as the description proceeds.

According to one aspect of this invention, there is provided an environmental load assessing device comprising input means for inputting environmental load data of at least one product, data storing means connected to the input means for storing the data inputted from the input means, environmental load assessing means connected to the data storing means for performing an environmental load assessment based on the data stored in the data storing means, and display means connected to the environmental load assessing means for displaying a result of the environmental load assessment performed by the environmental load assessing means. In the environmental load assessing device, the data storing means includes an object data storage section comprising an object-oriented database which stores, as objects, first parts constituting the at least one product and second parts constituting the first parts.

According to another aspect of this invention, there is provided an environmental load assessing device comprising input means for inputting environmental load data of at least one product, data storing means connected to the input means for storing the data inputted from the input means, environmental load assessing means connected to the data storing means for performing an environmental load assessment based on the data stored in the data storing means, and display means connected to the environmental load assessing means for displaying a result of the environmental load assessment performed by the environmental load assessing means. In the environmental load assessing device, the data storing means includes an object data storage section comprising an object-oriented database which stores, as objects, first processes in a life cycle of the at least one product and second processes constituting the first processes.

According to still another aspect of this invention, there is provided an environmental load assessing device comprising input means for inputting environmental load data of at least one product, data storing means connected to the input means for storing the data inputted from the input means, environmental load assessing means connected to the data storing means for performing an environmental load assessment based on the data stored in the data storing means, and display means connected to the environmental load assessing means for displaying a result of the environmental load assessment performed by the environmental load assessing means. In the environmental load assessing device, the data storing means includes an object data storage section comprising an object-oriented database which stores, as objects, at least one of a first and a second group, the first group being of first parts constituting the at least one product and second parts constituting the first parts, the second group being of first processes in a life cycle of the at least one product and second processes constituting the first processes.

DESCRIPTION OF THE PREFERRED EMBODIMENTS

Now, preferred embodiments of the present invention will be described hereinbelow with reference to the accompanying drawings.

Figure 1:
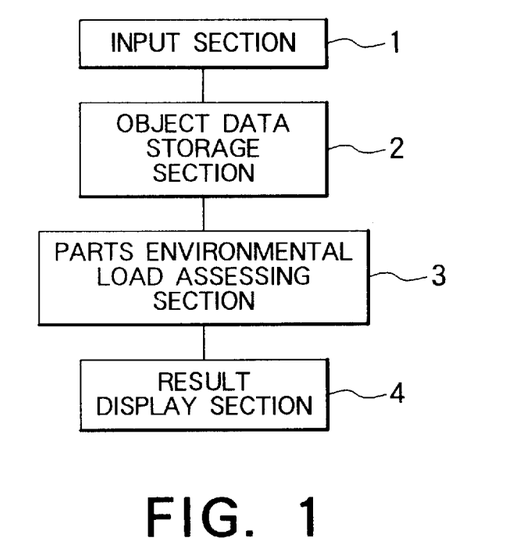
FIG. 1 is a block diagram showing a structure of an environmental load assessing device according to a first preferred embodiment of the present invention.

FIG. 1 is a block diagram showing a structure of an environmental load assessing device according to a first preferred embodiment of the present invention. As shown in FIG. 1, the environmental load assessing device includes an input section 1, an object data storage section 2, a parts environmental load assessing section 3 and a result display section 4.

The environmental load assessing device can be constituted, for example, as a computer system installed with an environmental load assessing program. In this case, the input section 1 is an input device, such as a keyboard or a mouse, the object data storage section 2 is a storage device, such as a magnetic disk or a magneto-optic disk, the parts environmental load assessing section 3 is a processing unit installed with the environmental load assessing program, and the result display section 4 is an output device, such as a CRT. Data displayed on the result display section 4 can be outputted via an output device, such as a printer.

The input section 1 is used for inputting identification data, such as names, of parts constituting a product to be assessed (hereinafter referred to as "assessment product"), coupling relationships between the parts, and attribute data of the parts. The attribute data of the parts are used for performing an environmental load assessment about a parts structure of the assessment product.

The object data storage section 2 stores the data inputted from the input section 1. The object data storage section 2 is composed of an object-oriented database having an object-oriented data model as a data model. Among the data inputted from the input section 1, the parts forming the assessment product are stored as objects, respectively. The attribute data of the parts are stored as attribute data of objects corresponding to those parts. The coupling relationships between the parts are defined by classes and attribute data of objects corresponding to those parts and stored.

The parts environmental load assessing section 3 derives an environmental load assessment value about a parts structure of the assessment product based on the identification data, such as the names, of the parts constituting the assessment product, the coupling relationships between the parts, and the attribute data of the parts stored in the object data storage section 2. The result display section 4 displays the data inputted from the input section 1 and the derived environmental load assessment value.

Now, an operation of the environmental load assessing device in this preferred embodiment will be described hereinbelow.

In this preferred embodiment, the object data storage section 2 is composed of the object-oriented database, and the parts of the assessment product inputted from the input section 1 are stored as the objects, respectively. The coupling relationships between the parts are defined by the classes and the attribute data of the objects and stored. Thus, the parts structure of the actual product having a large number of the parts can be described in detail and stored.

Further, since the attribute data of the parts are stored as the attribute data of the objects corresponding to those parts, the sizes and the logical storage locations of the respective attribute data do not form the premise for reading out the attribute data by the parts environmental load assessing section 3. Thus, it is possible to change the contents of an environmental load assessing procedure, or add a new environmental load assessing procedure to perform execution of a plurality of environmental load assessments.

Further, the object data storage section 2 can store data about not only a parts structure of a single product but parts structures of a plurality of products. By storing the data of the plurality of products, comparison in environmental load assessment about the parts structures is possible between the products.

Figure 2:
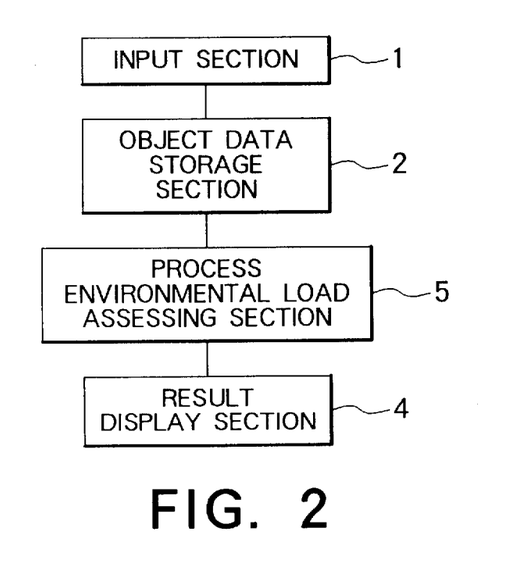
FIG. 2 is a block diagram showing a structure of an environmental load assessing device according to a second preferred embodiment of the present invention.

FIG. 2 is a block diagram showing a structure of an environmental load assessing device according to a second preferred embodiment of the present invention. As shown in FIG. 2, the environmental load assessing device includes an input section 1, an object data storage section 2, a process environmental load assessing section 5 and a result display section 4.

The input section 1 is used for inputting identification data, such as names, of processes in a life cycle of an assessment product, coupling relationships between the processes, and attribute data of the processes. The attribute data of the processes are used for performing an environmental load assessment about a life-cycle flow of the assessment product. The object data storage section 2 stores the data inputted from the input section 1.

The object data storage section 2 is composed of an object-oriented database having an object-oriented data model as a data model. Among the data inputted from the input section 1, the processes in the life cycle of the assessment product are stored as objects, respectively. The attribute data of the processes are stored as attribute data of objects corresponding to those processes. The coupling relationships between the processes are defined by classes and attribute data of objects corresponding to those processes and stored.

The process environmental load assessing section 5 derives an environmental load assessment value about a life-cycle flow of the assessment product based on the identification data, such as the names, of the processes in the life cycle of the assessment product, the coupling relationships between the processes, and the attribute data of the processes stored in the object data storage section 2. The result display section 4 displays the data inputted from the input section 1 and the derived environmental load assessment value.

Now, an operation of the environmental load assessing device in this preferred embodiment will be described hereinbelow.

In this preferred embodiment, the object data storage section 2 is composed of the object-oriented database, and the processes of the assessment product inputted from the input section 1 are stored as the objects, respectively. The coupling relationships between the processes are defined by the classes and the attribute data of the objects and stored. Thus, the life-cycle flow of the actual product having a large number of the processes can be described in detail and stored.

Further, since the attribute data of the processes are stored as the attribute data of the objects corresponding to those processes, the sizes and the logical storage locations of the respective attribute data do not form the premise for reading out the attribute data by the process environmental load assessing section 5. Thus, it is possible to change the contents of an environmental load assessing procedure, or add a new environmental load assessing procedure to perform execution of a plurality of environmental load assessments.

Further, the object data storage section 2 can store data about not only a life-cycle flow of a single product but life-cycle flows of a plurality of products. By storing the data of the plurality of products, comparison in environmental load assessment about the life-cycle flows is possible between the products.

Figure 3:
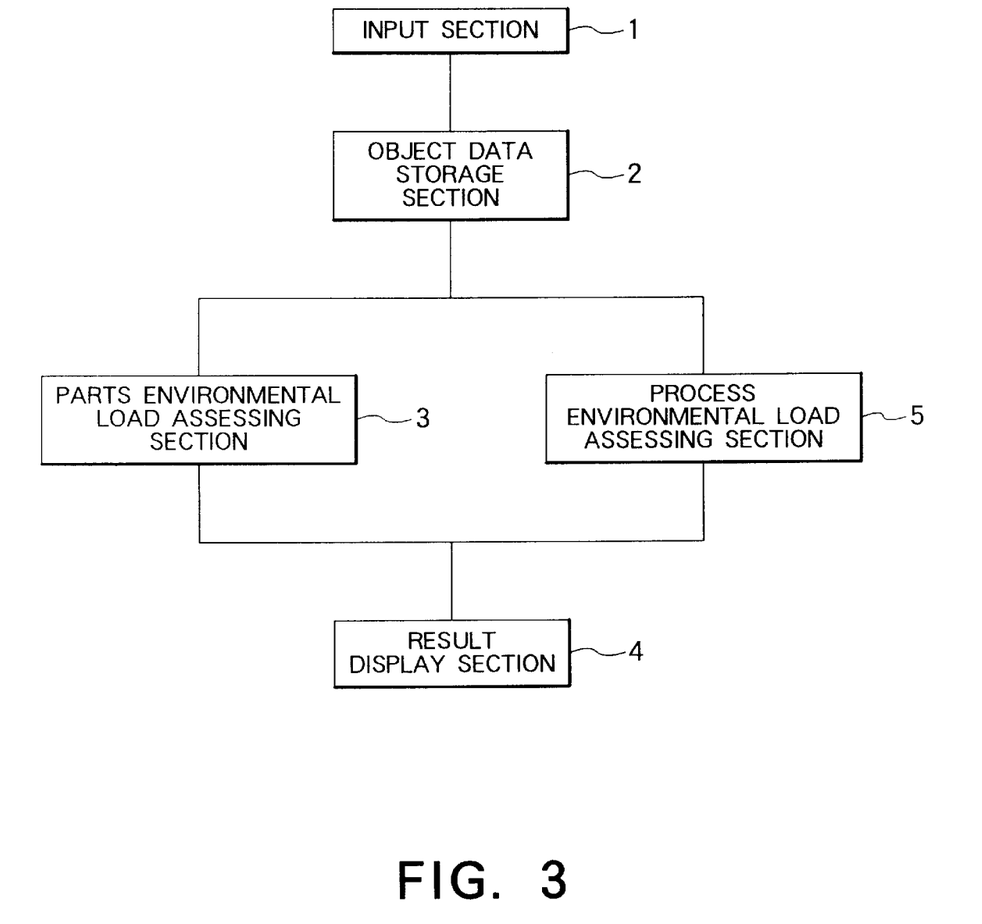
FIG. 3 is a block diagram showing a structure of an environmental load assessing device according to a third preferred embodiment of the present invention.

FIG. 3 is a block diagram showing a structure of an environmental load assessing device according to a third preferred embodiment of the present invention. As shown in FIG. 3, the environmental load assessing device includes an input section 1, an object data storage section 2, a parts environmental load assessing section 3, a process environmental load assessing section 5 and a result display section 4.

The input section 1 is used for inputting identification data, such as names, of parts constituting an assessment product and of processes in a life cycle of the assessment product, coupling relationships between the parts and between the processes, and attribute data of the parts and the processes. The attribute data of the parts and the processes are used for performing environmental load assessments about a parts structure and a life-cycle flow of the assessment product. The object data storage section 2 stores the data inputted from the input section 1.

The object data storage section 2 is composed of an object-oriented database having an object-oriented data model as a data model. Among the data inputted from the input section 1, the parts of the assessment product and the processes in the life cycle of the assessment product are stored as objects, respectively. The attribute data of the parts and the processes are stored as attribute data of objects corresponding to those parts and processes. The coupling relationships between the parts and between the processes are defined by classes and attribute data of objects corresponding to those parts and processes and stored.

The parts environmental load assessing section 3 derives an environmental load assessment value about a parts structure of the assessment product based on the identification data, such as the names, of the parts constituting the assessment product, the coupling relationships between the parts, and the attribute data of the parts stored in the object data storage section 2. The process environmental load assessing section 5 derives an environmental load assessment value about a life-cycle flow of the assessment product based on the identification data, such as the names, of the processes in the life cycle of the assessment product, the coupling relationships between the processes, and the attribute data of the processes stored in the object data storage section 2. The result display section 4 displays the data inputted from the input section 1 and the derived environmental load assessment values.

Now, an operation of the environmental load assessing device in this preferred embodiment will be described hereinbelow.

In this preferred embodiment, the data about the parts structure and the life-cycle flow of the assessment product are inputted from the single input section 1 and stored in the single object data storage section 2. Thus, the environmental load assessments about both the parts structure of the assessment product and the life-cycle flow of the assessment product can be achieved with the single environmental load assessing device.

Further, in this environmental load assessing device, the data about the parts structure and the data about the life-cycle flow can be inputted at the same time. Since these data are somewhat overlapped or resembled with each other, the efficiency in data input can be improved.

Further, the object data storage section 2 can store data about not only a parts structure and a life-cycle flow of a single product but parts structures and life-cycle flows of a plurality of products. By storing the data of the plurality of products, comparison in environmental load assessment about the parts structures and the life-cycle flows is possible between the products.

Figure 4:
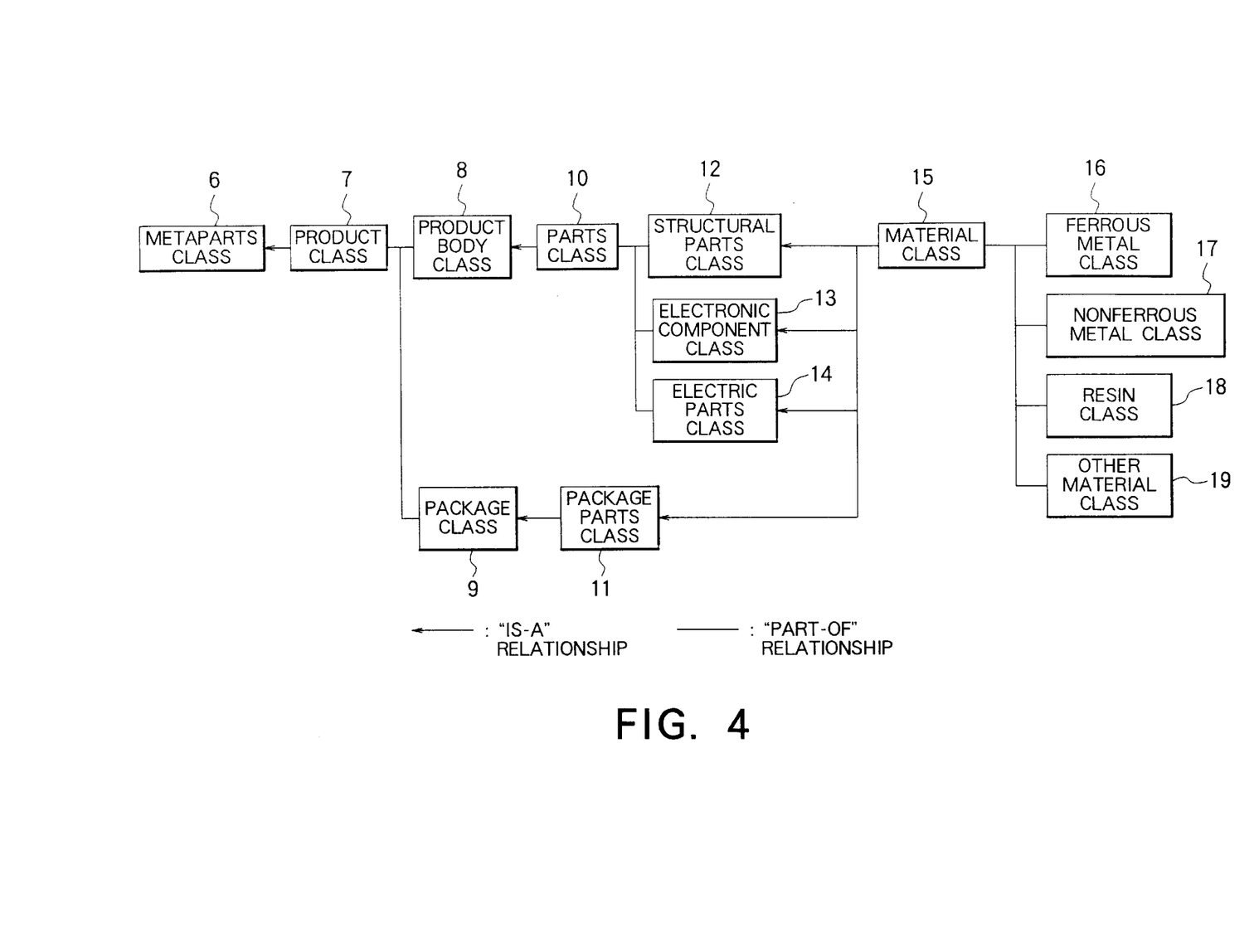
FIG. 4 is a block diagram showing an example of a class structure of an object data storage section shown in FIG. 1.

FIG. 4 is a block diagram showing an example of a class structure of the object data storage section 2 shown in FIG. 1. In FIG. 4, an arrow represents an "is-a" relationship that a class on the left of the arrow inherits the property of a class on the right of the arrow. On the other hand, a line without arrow represents a "part-of" relationship that a class on the right of the line is a part of a class on the left of the line.

In FIG. 4, a metaparts class 6 is a virtual class representing all products and parts, and a product class 7 is produced from the metaparts class 6. The product class 7 is composed of a product body class 8 and a package member class 9. By providing such classes, the rate of an environmental load generated by the product body and an environmental load generated by the package can be easily derived.

The product body class 8 is composed of a parts class 10. By setting the parts class 10 to have a nested structure, a complicated parts structure can be described.

The package class is composed of a package parts class 11. By setting the packing parts class to have a nested structure, a complicated parts structure can be described.

The parts class 10 is composed of a structural parts class 12 representing those parts mechanically supporting the body, an electronic component class 13 representing printed board parts and electronic parts mounted thereon, and an electric parts class 14 representing parts other than those represented by the classes 12 and 13. Although these classes are only applicable to the electric products, the rate of an environmental load generated by the structural parts, an environmental load generated by the substrate parts and an environmental load generated by the electric parts can be easily derived by providing those classes.

A material class 15 is a virtual class representing all materials of the products, the parts and the packages. The material class 15 is composed of a ferrous metal class 16, a nonferrous metal class 17, a resin class 18 and an other material class 19 representing materials other than those represented by the classes 16–18. By providing these classes, the rate of an environmental load generated by the ferrous metals, an environmental load generated by the nonferrous metal materials, an environmental load generated by the resin materials and an environmental load generated by the other materials can be easily derived.

Now, an example of attributes of an object in the first preferred embodiment will be described hereinbelow. The attributes include a child object name, a child object number, a size, an occupied volume, a weight, a construction material, a contained harmful substance name, contained harmful substance data and drawing data.

The child object name attribute is identification data, such as numerals or characters, about a child object which is an object representing a part forming a subject part. The child object number attribute represents a contribution of an attribute value of the child object with respect to an attribute value, having additivity such as the weight, of an object representing the subject part. For example, when a part A is composed of two parts B, a child object number of an object representing the part A about the parts B is 2. An arbitrary object has one or more pairs of child object names and numbers. By providing such attributes, coupling relationships between the parts can be defined.

The size attribute is a combination of numerals representing a width, a depth and a height of the subject part. By providing such an attribute, a difficulty in disassembling of the part from the product due to the size of the part being large, for example, one side longer than 1m, and a difficulty in recovering and carrying of the part can be assessed. On the other hand, a difficulty in crushing of the part can be assessed owing to the size of the part being large, for example, its thickness greater than 5 mm. Further, by deriving an area of a substrate of the electronic product, a degree of reduction in size of the substrate can be assessed.

The occupied volume attribute is a numeric value representing a volume of the subject part. By providing such an attribute, a degree of reduction in size of the product or the part can be assessed. Further, a difficulty in disassembling of the part from the product due to a volume of the part being large can be assessed.

The weight attribute is a numeric value representing a weight of the subject part. By providing such an attribute, a degree of reduction in weight of the product or the part can be assessed. Further, a difficulty in disassembling of the part from the product due to a weight of the part being large can be assessed. Moreover, by deriving a density of the part through combination with the volume attribute, a difficulty in disassembling of the part from the product due to a density of the part being large can be assessed.

The construction material attribute is identification data, such as numerals or characters, about a material of the subject part. By providing such an attribute, a list of construction materials used in the product can be obtained. Further, through combination with the weight attribute, a weight can be derived per construction material used in the product. Further, by defining a resin material and a metal material from among the construction materials to derive weights of these materials, a degree of reduction in weight of these materials can be assessed. Further, by defining a recyclable material from among the construction materials to derive a weight thereof, a using amount of the recyclable material can be derived. Further, by defining a recycled material from among the construction materials to derive a weight thereof, a using amount of the recycled material can be derived. Further, by defining a composite material from among the construction materials to derive a weight thereof, a degree of reduction in weight of the composite material can be assessed. Moreover, presence or absence of parts which require the treatment after recovery of the product, for example, glasses such as cathode ray tubes, and batteries such as nickel-cadmium batteries, in the construction materials as well as the number of those parts can be determined. Further, through combination with the weight attribute, the total weight of the parts which require the treatment after recovery of the product can be derived.

The contained harmful substance name attribute is identification data, such as numerals or characters, about a harmful substance contained in the subject part. The contained harmful substance data attribute is a true-false value or a numeric value showing whether the harmful substance is contained. The metaparts class 6 has one or more pairs of contained harmful substance names and contained harmful substance data. By providing such attributes, presence or absence of parts containing a harmful substance, such as heavy metal, a compound thereof, an chlorinated organic compound or an ozone layer depletion substance, as well as the number of those parts can be determined. Further, through combination with the weight attribute, the total weight of the parts containing the harmful substance/substances can be derived.

The drawing data attribute is two-dimensional or three-dimensional drawing data of the subject part. By providing such an attribute, a detachability of the part can be assessed.

Further, presence or absence of disassemble-difficult parts formed by, for example, insert molding, out-sert molding or metal insert into resin, as well as the number of those parts can be determined. Moreover, through combination with the weight attribute, the total weight of the disassemble-difficult parts can be derived.

Figure 5:
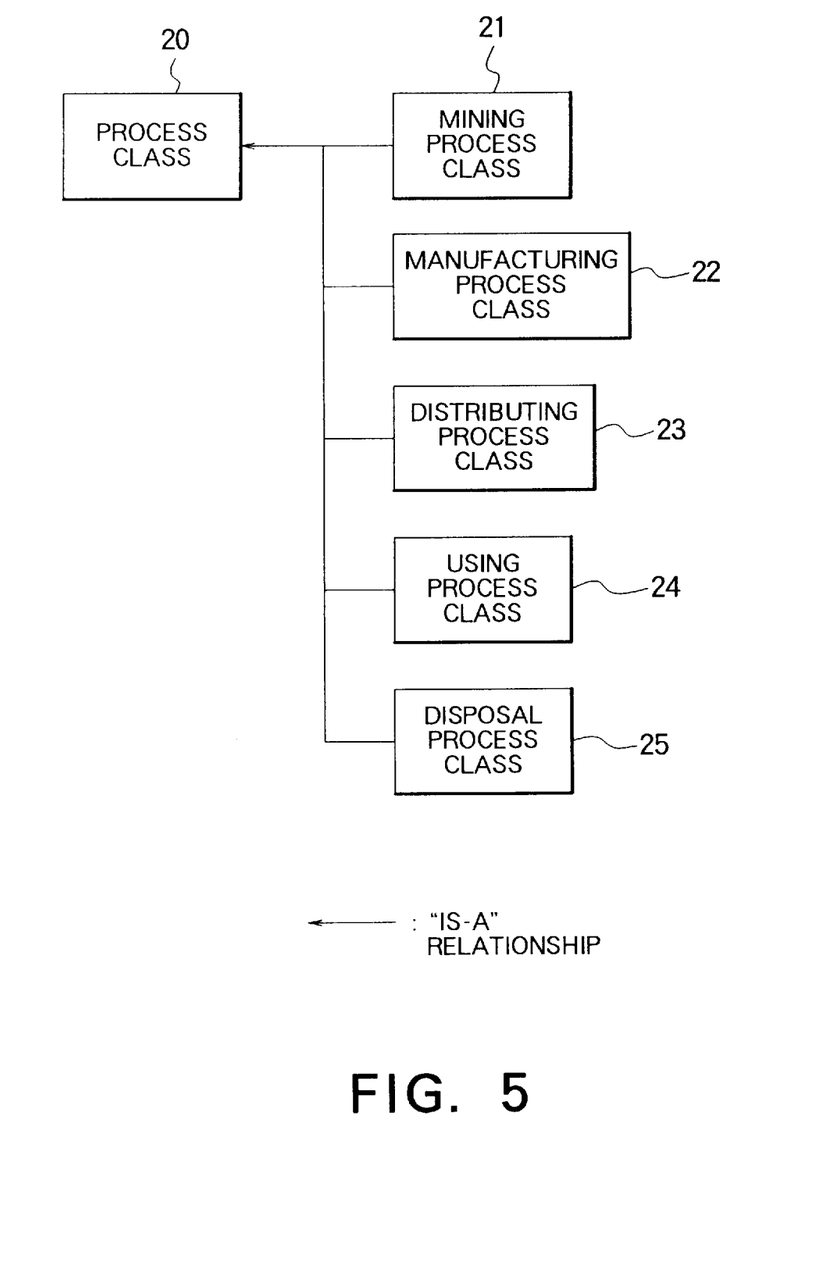
FIG. 5 is a block diagram showing an example of a class structure of an object data storage section shown in FIG. 2.

FIG. 5 is a block diagram showing an example of a class structure of the object data storage section 2 shown in FIG. 2. In FIG. 5, an arrow represents an "is-a" relationship that a class on the left of the arrow inherits the property of a class on the right of the arrow.

A process class 20 is a virtual class representing all processes in the life cycle of the product. The process class 20 is composed of a mining process class 21, a manufacturing process class 22, a distributing process class 23, a using process class 24 and a disposal process class 25. By setting these classes to have nested structures, a complicated life-cycle flow can be described. By providing such classes, the rate of an environmental load generated from the mining process, an environmental load generated from the manufacturing process, an environmental load generated from the distributing process, an environmental load generated from the using process and an environmental load generated from the disposal process can be easily derived.

Now, an example of attributes of an object in the second preferred embodiment will be described hereinbelow. The attributes include a child object name, a child object number, an air pollution substance name, an air pollution substance discharge amount, a water pollution substance name, a water pollution substance discharge amount, a solid waste name, a solid waste discharge amount, a raw material name, a raw material consumption amount, a used harmful substance name and used harmful substance data.

The child object name attribute is identification data, such as numerals or characters, about a child object which is an object representing a process put before or after a subject process. The child object number attribute represents a contribution of an attribute value of the child object with respect to an attribute value, having additivity such as the weight, of an object representing the subject process. For example, when considering a part A composed of two parts B, a child object number of an object representing a manufacturing process of the part A about the parts B is 2. An arbitrary object has one or more pairs of child object names and numbers. By providing such attributes, coupling relationships between the processes can be defined.

The air pollution substance name attribute is identification data, such as numerals or characters, about an air pollution substance discharged in the subject process. The air pollution substance discharge amount attribute is a numeric value about a discharge amount of the air pollution substance. The process class 20 has one or more pairs of air pollution substance names and air pollution substance discharge amounts. By providing such attributes, a discharge amount can be derived per air pollution substance.

The water pollution substance name attribute is identification data, such as numerals or characters, about a water pollution substance discharged in the subject process. The water pollution substance discharge amount attribute is a numeric value about a discharge amount of the water pollution substance. The process class 20 has one or more pairs of water pollution substance names and water pollution substance discharge amounts. By providing such attributes, a discharge amount can be derived per water pollution substance.

The solid waste name attribute is identification data, such as numerals or characters, about a solid waste discharged in the subject process. The solid waste discharge amount attribute is a numeric value about a discharge amount of the solid waste. The process class 20 has one or more pairs of solid waste names and solid waste discharge amounts. By providing such attributes, a discharge amount can be derived per solid waste.

The raw material name attribute is identification data, such as numerals or characters, about a raw material consumed in the subject process. The raw material consumption amount attribute is a numeric value about a consumption amount of the raw material. The process class 20 has one or more pairs of raw material names and raw material consumption amounts. By providing such attributes, a consumption amount can be derived per raw material.

The used harmful substance name attribute is identification data, such as numerals or characters, about a harmful substance used in the subject process. The used harmful substance data attribute is a true-false value or a numeric value showing whether the harmful substance is used. The process class 20 has one or more pairs of used harmful substance names and used harmful substance data. By providing such attributes, presence or absence of processes using a substance which requires the treatment, such as an ozone layer depletion substance or an chlorinated organic compound, as well as the number of those processes can be determined.

Now, the first preferred embodiment will be described in further detail with reference to first to third examples.

In the first example, all the objects in the object data storage section 2 have the weight attributes and the parts construction material attributes. The parts environmental load assessing section 3 reads out the child object number attributes, the weight attributes and the parts construction material attributes with respect to the object corresponding to the assessment product and all the objects coupled thereto. From those attribute values, the parts environmental load assessing section 3 derives a weight of one product per construction material. The result display section 4 receives the derived weights of the product from the section 3 and displays them.

In the second example, all the objects in the object data storage section 2 each have one or more pairs of the contained harmful substance name attributes and the contained harmful substance data attributes. The parts environmental load assessing section 3 reads out the child object number attributes, the contained harmful substance name attributes and the contained harmful substance data attributes with respect to the object corresponding to the assessment product and all the objects coupled thereto. From those attribute values, the presence or absence of the parts containing the harmful substance and the number of those parts are determined. The result display section 4 displays the presence or absence of the parts containing the harmful substance and the number of those parts received from the parts environmental load assessing section 3.

In the third example, all the objects in the object data storage section 2 have the drawing data attributes. The parts environmental load assessing section 3 reads out the drawing data attributes with respect to the object corresponding to the assessment product and all the objects coupled thereto and assesses the disassemblability of the product based on the drawing data. The disassemblability of the product can be derived as the sum of the number of screws in all the drawings.

Further, if simulations of assembling and disassembling of the product are performed by displaying all the drawing data on the result display section 4 using a CAD system and by manipulating the drawing data via the input section 1, a further detailed disassemblability assessment result can be achieved per part. The result display section 4 displays the disassemblability assessment results of the product received from the parts environmental load assessing section 3.

Now, the second preferred embodiment will be described in further detail with reference to first and second examples.

In the first example, all the objects in the object data storage section 2 each have one or more pairs of the air pollution substance name attributes and the air pollution substance discharge amount attributes, one or more pairs of the water pollution substance name attributes and the water pollution substance discharge amount attributes, one or more pairs of the solid waste name attributes and the solid waste discharge amount attributes, and one or more pairs of the raw material name attributes and the raw material consumption amount attributes.

The process environmental load assessing section 5 reads out the child object number attributes, the air pollution substance name attributes, the air pollution substance discharge amount attributes, the water pollution substance name attributes, the water pollution substance discharge amount attributes, the solid waste name attributes, the solid waste discharge amount attributes, the raw material name attributes and the raw material consumption amount attributes with respect to all the objects relating to the life cycle of the assessment product. From those attribute values, the process environmental load assessing section 5 derives discharge amounts of the air pollution substance, the water pollution substance and the solid waste and a consumption amount of the raw material over the whole life cycle of the assessment product per air pollution substance, water pollution substance, solid waste and raw material. The result display section 4 receives the derived discharge amounts of the air pollution substance, the water pollution substance and the solid waste and the derived consumption amount of the raw material from the process environmental load assessing section 5 and displays them.

In the second example, all the objects in the object data storage section 2 each have one or more pairs of the used harmful substance name attributes and the used harmful substance data attributes.

The process environmental load assessing section 5 reads out the child object number attributes, the used harmful substance name attributes and the used harmful substance data attributes with respect to all the objects relating to the life cycle of the assessment product. From these attribute values, the process environmental load assessing section 5 determines the presence or absence of the processes using the harmful substance and the number of those processes. The result display section 4 displays the presence or absence of the processes using the harmful substance and the number of those processes received from the process environmental load assessing section 5.

According to the foregoing preferred embodiments, the following effects can be achieved:

The parts structure of the actual product having a large number of the parts and/or the life-cycle flow of the actual product having a large number of the processes can be described in detail and stored. As a result, the accuracy of the environmental load assessment is improved.

This effect is achieved because the parts and/or the processes of the assessment product are stored as the objects, and the coupling relationships between the parts and/or between the processes are defined by the classes and the attribute data of the corresponding objects and stored.

Further, it is possible to change the contents of an environmental load assessing procedure or add a new environmental load assessing procedure so as to perform execution of a plurality of environmental load assessments. As a result, expandability and maintainability of the environmental load assessing device are improved. The efficiency of the environmental load assessment is also improved.

This effect is achieved because the attribute data of the parts and/or the processes are stored as the attribute data of the objects corresponding to those parts and/or processes.

Further, the data about the parts structure and the data about the life-cycle flow, which are somewhat overlapped or resembled with each other, can be inputted at the same time. As a result, the efficiency of the environmental load assessment is improved.

This effect is achieved because the data about the parts structure and the data about the life-cycle flow, which are somewhat overlapped or resembled with each other, can be inputted at the same time. As a result, the efficiency of the environmental load assessment is improved. This effect is achieved because the data about the parts structure and the life-cycle flow of the assessment product are inputted via the single input section and stored in the single object data storage section.

While the present invention has been described in terms of the preferred embodiments, the invention is not to be limited thereto, but can be embodied in various ways without departing from the principle of the invention as defined in the appended claims.

What is claimed is:

1. An environmental load assessing device comprising:

input means for inputting environmental load data of at least one product;

data storing means connected to said input means for storing the data inputted from said input means;

environmental load assessing means connected to said data storing means for performing an environmental load assessment based on the data stored in said data storing means; and display means connected to said environmental load assessing means for displaying a result of the environmental load assessment performed by said environmental load assessing means, said data storing means including an object data storage section comprising an object-oriented database which stores, as objects, first parts constituting said at least one product and second parts constituting said first parts.

2. An environmental load assessing device as claimed in claim 1, wherein said object data storage section further comprising an object-oriented database which stores, as objects, first processes in a life cycle of said at least one product and second processes constituting said first processes.

3. An environmental load assessing device as claimed in claim 1, wherein at least a part of classes of the objects stored in said data storing means comprises pairs of:

child object name attributes representing names of child objects coupled to the objects; and child object number attributes representing contributions of additive attribute values of the child objects with respect to additive attribute values of the objects.

4. An environmental load assessing device as claimed in claim 1, wherein at least a part of classes of the objects stored in said data storing means comprises:

a class representing a body of the product; and a class representing a package member packing the body of the product.

5. An environmental load assessing device as claimed in claim 1, wherein at least a part of classes of the objects stored in said data storing means comprises a class representing parts constituting a body of the product.

6. An environmental load assessing device as claimed in claim 1, wherein at least a part of classes of the objects stored in said data storing means comprises a class representing package parts constituting a package member packing a body of the product.

7. An environmental load assessing device as claimed in claim 1, wherein at least a part of classes of the objects stored in said data storing means comprises:

a class representing structural parts among parts constituting a body of an electronic product, said structural parts mechanically supporting said body;

a class representing electronic component including printed board parts and electronic parts mounted thereon; and a class representing electric parts representing parts other than said structural parts and said electronic component.

8. An environmental load assessing device as claimed in claim 1, wherein at least a part of classes of the objects stored in said data storing means comprises:

a class representing a ferrous metal for parts constituting a body of the product and package parts packing the body of the product;

a class representing a nonferrous metal for parts constituting the body of the product and package parts;

a class representing a resin for parts constituting the body of the product and package parts; and a class representing a material other than said ferrous metal, said nonferrous metal, and said resin material.

9. An environmental load assessing device as claimed in claim 1, wherein at least a part of classes of the objects stored in said data storing means comprises attributes representing widths, depths, and heights of parts represented by said objects.

10. An environmental load assessing device as claimed in claim 1, wherein at least a part of classes of the objects stored in said data storing means comprises attributes representing occupied volumes of parts represented by said objects.

11. An environmental load assessing device as claimed in claim 1, wherein at least a part of classes of the objects stored in said data storing means comprises attributes representing weights of parts represented by said objects.

12. An environmental load assessing device as claimed in claim 1, wherein at least a part of classes of the objects stored in said data storing means comprises attributes representing construction materials of parts represented by said objects.

13. An environmental load assessing device as claimed in claim 1, wherein at least a part of classes of the objects stored in said data storing means comprises pairs of:

attributes representing a name of a harmful substance contained in parts represented by said objects; and attributes representing contained harmful substance data showing whether parts represented by said objects contain the harmful substance.

14. An environmental load assessing device as claimed in claim 1, wherein at least a part of classes of the objects stored in said data storing means comprises attributes representing drawing data of parts represented by said objects.

15. An environmental load assessing device as claimed in claim 1, wherein said data storing means stores said first and second parts as the objects, all the classes of said objects comprising:

attributes representing weights of the parts represented by said objects; and attributes representing construction materials of the parts, said environmental load assessing means comprising means for summing the weights of the parts represented by said objects per construction material, said display means displaying said summed weights derived by said environmental load assessing means.

16. An environmental load assessing device as claimed in claim 1, wherein said data storing means stores said first and second parts as the objects, all the classes of said objects comprising pairs of:

attributes representing a name of a harmful substance contained in the parts represented by said objects; and attributes representing contained harmful substance data showing whether the harmful substance is contained in the parts represented by said objects, said environmental load assessing means comprising means for determining presence or absence of the part containing the harmful substance among the parts represented by said objects in said data storing means, as well as the number of the parts containing the harmful substance, said display means displaying the presence or absence of the part containing the harmful substance and the number of the parts containing the harmful substance determined by said environmental load assessing means.

17. An environmental load assessing device as claimed in claim 1, wherein said data storing means stores said first and second parts as the objects, all the classes of said objects compring attributes representing drawing data of the parts represented by said objects, said environmental load assessing means comprising means for assessing disassemblability of the product, said display means displaying the disassemblability of the product assessed by said environmental load assessing means.

18. An environmental load assessing device as claimed in claim 17, wherein said environmental load assessing means determines, based on said drawing data, detachabilities of the parts presence or absence of the disassemble-difficult part, and the number of the disassemble-difficult parts so as to assess a disassemblability of the product.

19. An environmental load assessing device comprising:

input means for inputting environmental load data of at least one product;

data storing means connected to said input means for storing the data inputted from said input means;

environmental load assessing means connected to said data storing means for performing an environmental load assessment based on the data stored in said data storing means; and display means connected to said environmental load assessing means for displaying a result of the environmental load assessment performed by said environmental load assessing means, said data storing means including an object data storage section comprising an object-oriented database which stores, as objects, first processes in a life cycle of said at least one product and second processes constituting said first processes.

20. An environmental load assessing device as claimed in claim 19, wherein at least a part of classes of the objects stored in said data storing means comprises:
- a class representing a raw material mining process of the product;
- a class representing a manufacturing process of the product;
- a class representing a distributing process of the product;
- a class representing a using process of the product; and
- a class representing a disposal process of the product.

21. An environmental load assessing device as claimed in claim 19, wherein at least a part of classes of the objects stored in said data storing means comprises pairs of:
- attributes representing a name of an air pollution substance discharged in the processes represented by said objects; and
- attributes representing discharge amounts of said air pollution substance.

22. An environmental load assessing device as claimed in claim 19, wherein at least a part of classes of the objects stored in said data storing means comprises pairs of:
- attributes representing a name of a water pollution substance discharged in the processes represented by said objects; and
- attributes representing discharge amounts of said water pollution substance.

23. An environmental load assessing device as claimed in claim 19, wherein at least a part of classes of the objects stored in said data storing means comprises pairs of:
- attributes representing a name of a solid waste discharged in the processes represented by said objects; and
- attributes representing discharge amounts of said solid waste.

24. An environmental load assessing device as claimed in claim 19, wherein at least a part of classes of the objects stored in said data storing means comprises pairs of:
- attributes representing a name of a raw material consumed in the processes represented by said objects; and
- attributes representing consumption amounts of said raw material.

25. An environmental load assessing device as claimed in claim 19, wherein at least a part of classes of the objects stored in said data storing means comprises pairs of:
- attributes representing a name of a harmful substance used in the process represented by said object; and
- attributes representing contained harmful substance data showing whether the process represented by said object uses the harmful substance.

26. An environmental load assessing device as claimed in claim 19, wherein said data storing means stores said first and second processes as the objects, all the classes of said objects comprising:
- pairs of attributes representing a name of an air pollution substance discharged in the processes represented by said objects and attributes representing discharge amounts of said air pollution substance;
- pairs of attributes representing a name of a water pollution substance discharged in the processes represented by said objects and attributes representing discharge amounts of said water pollution substance;
- pairs of attributes representing a name of a solid waste discharged in the processes represented by said object and attributes representing discharge amounts of said solid waste; and
- pairs of attributes representing a name of a raw material consumed in the processes represented by said object and attributes representing consumption amounts of said raw material, said environmental load assessing means including means for summing the discharge amounts of the air pollution substance, the water pollution substance, and the solid waste and the consumption amounts of the raw material over the whole life cycle of the product per the air pollution substance, the water pollution substance, the solid waste, and the raw material, said environmental load assessing means producing a summing value of the discharge amounts and/or the consumption amounts per air pollution substance, water pollution substance, solid waste, and raw material, said display means displaying summing value.

27. An environmental load assessing device as claimed in claim 19, wherein said data storing means stores said first and second processes as the objects, all the classes of said objects compring pairs of attributes representing a name of a harmful substance used in the process represented by said object and attributes representing contained harmful substance data showing whether the harmful substance is used in the process represented by said object, said environmental load assessing means comprising means for determining presence or absence of the process using the harmful substance among the processes represented by said objects in said data storing means, as well as the number of the processes using the harmful substance, said display means displaying the presence or absence of the processes using the harmful substance and the number of the processes using the harmful substance determined by said environmental load assessing means.

28. An environmental load assessing device comprising:
- input means for inputting environmental load data of at least one product;
- data storing means connected to said input means for storing the data inputted from said input means;
- environmental load assessing means connected to said data storing means for performing an environmental load assessment based on the data stored in said data storing means; and
- display means connected to said environmental load assessing means for displaying a result of the environmental load assessment performed by said environmental load assessing means, said data storing means including an object data storage section comprising an object-oriented database which stores, as objects, at least one of a first and a second group, said first group being of first parts constituting said at least one product and second parts constituting said first parts, said second group being of first processes in a life cycle of said at least one product and second processes constituting said first processes.

* * * * *